US006049607A

United States Patent [19]

Marash et al.

[11] Patent Number: 6,049,607

[45] Date of Patent: Apr. 11, 2000

[54] INTERFERENCE CANCELING METHOD AND APPARATUS

[75] Inventors: Joseph Marash, Haifa; Baruch Berdugo, Kiriat-Ata, both of Israel

[73] Assignee: Lamar Signal Processing, Yokneam, Israel

[21] Appl. No.: 09/157,035

[22] Filed: Sep. 18, 1998

[51] Int. Cl.[7] .............................. H04M 9/08; H03R 3/00

[52] U.S. Cl. ............................ 379/410; 379/407; 381/92; 381/94.1; 367/121

[58] Field of Search .................................... 379/407, 406, 379/408, 409, 410, 411, 416; 381/92, 94.1, 91.2, 94.7, 155; 367/116, 117, 118, 119–127; 708/322

[56] References Cited

U.S. PATENT DOCUMENTS

| | | | |
|---|---|---|---|
| 4,965,834 | 10/1990 | Miller | 381/94.1 |
| 5,226,016 | 7/1993 | Christman | 367/135 |
| 5,627,799 | 5/1997 | Hoshuyama | 367/121 |
| 5,825,898 | 10/1998 | Marash | 381/92 |

*Primary Examiner*—Forester W. Isen
*Assistant Examiner*—Jacques Saint-Surin
*Attorney, Agent, or Firm*—Frommer Lawrence & Haug LLP; Thomas J. Kowalski

[57] ABSTRACT

Interference canceling is provided for canceling, from a target signal generated from a target source, an interference signal generated by an interference source. The beam splitter beam-splits the target signal into a plurality of band-limited target signals band-limited frequency bands and beam-splits the interference signal into corresponding band-limited frequency bands. The adaptive filter adaptively filters each band-limited interference signal from each corresponding band-limited target signal. The inhibitor can permit the adaptive filter to adapt or change coefficients when a signal-to-noise ratio of the reference signal exceeds a predetermined threshold, to be determined periodically, over a signal-to-noise ratio of the main signal. The beam selector selects at least one of a plurality of beams for adaptive filtering by the adaptive filter representing a direction from which the main signal is received. The beam selector selects beams simultaneously to improve accuracy and, in particular, selects a beam having a fixed direction and a beam which rotates in direction. The noise gate gates the main signal adaptively filtered by the adaptive filter by opening the noise gate when a signal-to-noise ratio at the near end is above a predetermined threshold and closing the noise gate when the signal-to-noise ratio at the near end is below the predetermined threshold. When the target signal represents speech generated at a near end of a teleconference, the adaptive filter cancels an echo present in the reference signal broadcast to a far end of the teleconference.

37 Claims, 7 Drawing Sheets

INTERFERENCE CANCELING METHOD AND APPARATUS

RELATED APPLICATIONS

Reference is made to co-pending U.S. application Ser. Nos. 08/672,899 (allowed), 09/130,923, 08/840,159, 09/059,503 and 09/055,709, each of which is hereby incorporated herein by reference; and each and every document cited in those applications, as well as each and every document cited herein, is hereby incorporated herein by reference.

FIELD OF THE INVENTION

The present invention relates to an interference canceling method and apparatus and, for instance, to an echo canceling method and apparatus which provides echo-canceling in full duplex communication, especially teleconferencing communications.

BACKGROUND OF THE INVENTION

Tele-conferencing plays an extremely important role in communications today. The teleconference, particularly the telephone conference call, has become routine in business, in part because teleconferencing provides a convenient and inexpensive forum by which distant business interests communicate. Internet conferencing, which provides a personal forum by which the speakers can see one another, is enormously popular on the home front, in part because it brings together distant family and friends without the need for expensive travel.

In a teleconferencing system, the sounds present in a room, hereinafter referred to as the "near-end room" such as those of a near-end speaker are received by a microphone, transmitted to a "far end system" and broadcast by a far-end loudspeaker. Similarly, the far-end speaker is received by the far-end microphones and transmitted to the near-end system, and broadcast by the near-end loudspeaker. The near-end microphone receives the broadcasted sounds along with their reverberations and transmits them back to the far-end, together with the desired signals generated by, for example, speakers at the near-end, thereby resulting in a disturbing echo heard by the speaker at the far-end. The far-end speaker will hear himself after the sound has traveled to the near-end system and back, thereby resulting in a delayed echo which will annoy and confuse the far-end speaker. The problem is compounded in video and internet conferencing systems where the delay is more extremely pronounced.

The simplest way to overcome the problem of echo is by blocking the near-end microphone while the far-end signal is broadcast by the near-end loudspeaker. Sometimes referred to as "ducking", the technique of blocking the microphone is effectively a half-duplex communication. Problematically, if the microphone is blocked for a prolonged period to avoid transmission of the reverberations, the half-duplex communication becomes a significant drawback because the far-end speaker will lose too much of the near-end speaker. In the video or Internet conferencing system, where the delay created by the communication lines is extreme, ducking becomes quite annoying.

A more complex method to avoid echo is to employ an echo canceling system which measures the signals send from the far-end and broadcast it the near-end loudspeaker, estimates the resulting signal present at the near-end microphone (including the reverberations) and subtracts those signals representing the echo from the near-end microphone signals. The echo-free signals are then transmitted back to the far-end system.

In order to reduce the echo from the near-end microphone signal, it is required to obtain the transfer function that expresses the relationship between the near-end loudspeaker signal and the reverberations as they actually appear at the near-end microphone. This transfer function depends on the relative position of the near-end loudspeaker to the near-end microphone, the room structure, position of the system and even the presence of people in the room. Since it is impossible to predict these parameters a priori, it is preferred that the echo-canceling system updates the transfer function continuously in real time.

The adaptation process by which the echo-canceling system is updated in real time may be an LMS (least means square) adaptive filter (Widrow, et al., Proc. IEEE, vol. 63, pp. 1692–1716, Proc. IEEE, vol. 55, No. 12, December 1967) with the far-end signal used as the reference signal. The LMS filter estimates the interference elements (echoes) present in the interfered channel by multiplying the reference channel by a filter and subtracting the estimated elements from the interfered signal. The resulting output is used for updating the filter coefficients. The adaptation process will converge when the resulting output energy is at a minimum, leaving an echo-free signal.

Important to the adaptation process is the selection of the size of the adaptation step of the filter coefficients. In the standard LMS algorithm the step size is controlled by a predetermined adaptation coefficient, the level of the reference channel and the output level. In other words, the adaptation process will have bigger steps for strong signals and smaller steps for weaker signals.

A better behaved system is one in which its adaptation steps are independent of the reference channel levels. This is accomplished by normalizing the adaptation coefficient by the reference channel energy, this method is called the Normalized Least Mean Square (NLMS) as, for example, described in see for example "*A Family of Normalized LMS Algorithms*", Scott C. Douglas, IEEE Signal Processing Letters, Vol. 1, No. 3, March 1994. It should be noted that the energy estimator, if not designed properly, may fail to track when large and fast changes in the level of the reference channel occur. Thus, the normalized coefficient may be too big during the transition period, and the filter coefficient may diverge.

Another problem is that the adaptive process feeds the output back to determine the new filter coefficients. When the interfering elements in the signal are less pronounced than the non-interfering signal, there is not much to reduce and the filter may diverge or converge to a wrong value which results in signal distortions.

When properly converged, the adaptive filter actually estimates the transfer function between the far-end loudspeaker signal and the echo elements in the main channel. However, changes in the room will effect a change in the transfer function and the adaptive process will adapt itself to the new conditions. Sudden or quick changes, in particular, will take the adaptive filter time to adjust for and an echo will be present until the filter adapts itself to the new conditions.

In order to improve the audio quality, sometimes a number of microphones are used instead of a single one. This system either selects a different microphone each time someone is speaking in the room or creates a directional beam using a linear combination of microphones. By multiplexing the microphones or steering the directional audio beam, the relationship between the loudspeaker signal and the audio signal obtained by the microphones can be changed. Problematically, each time such a transition takes place, an echo will "leak" into the system until the new condition has been studied by the adaptive filter. To allow the use of a steerable directional beam and prevent the transient echo, one can either perform continuous echo canceling on each of the microphones separately or on each of the microphone combinations (the combinations of microphones could be infinite). However, the increase in the computation load required to perform numerous echo-canceling systems concurrently on each of the microphones or allowable beams is not realistic.

An efficient echo-canceling system is needed which will reduce the echo drastically. However, because of the large dynamic ranges required by the microphone to be able to pick up very low voices, the microphone will most likely pick up some of the residual echo as well. The residual echo is most disturbing when no other signal is present but less noticed when a full duplex discussion is taking place.

Another problem typical to multi-user conferencing systems is that the background noise from several systems is transmitted to all the participating systems and it is preferred that this noise be reduced to a minimum. The beam forming process reduces the background noise but not enough to account for the plurality of systems.

OBJECTS AND SUMMARY OF THE INVENTION

It is therefore an object of the invention to provide an interference canceling system.

It is another object of the invention to provide an interference canceling system to cancel interference while providing full duplex communication.

It is yet another object of the invention to provide an interference canceling system to cancel an echo present in a teleconference.

It is still another object of the present invention to provide an interference canceling system to cancel an echo present in video teleconferencing.

It is further an object of the invention to allow a steerable directional audio beam to function with the interference canceling system of the present invention.

It is yet a further object of the invention to overcome background noise in the conferencing system and reduce the residual echo to a minimum.

In accordance with the foregoing objectives, the present invention provides an interference canceling system, method and apparatus for canceling, from a target signal generated from a target source, an interference signal generated by an interference source. A main input inputs the target signal generated by the target source. A reference input inputs the interference signal generated by the interference source. A beam splitter beam-splits the target signal into a plurality of band-limited target signals and beam-splits the interference signal into band-limited interference signals. Preferably, the amount and frequency of band-limited target signals equals the amount and frequency of band-limited interference signals, whereby for each band-limited target signal there is a corresponding band-limited interference signal. An adaptive filter adaptively filters, each band-limited interference signal from each corresponding band-limited target signal.

When the target signal represents speech generated at a near end of a teleconference, the adaptive filter of the present invention cancels an echo present in the reference signal broadcast from a far end of the teleconference. It is preferred that the adaptive filter is an adaptive filter array with each adaptive filter in the array filtering a different frequency band. In the exemplary embodiment the adaptive filter estimates a transfer function of the reference signal broadcast from the far end.

The adaptive filter of the present invention may further comprise an inhibitor. The inhibitor permits the adaptive filter to adapt (change coefficients) when a signal-to-noise ratio of the reference signal exceeds a predetermined threshold over a signal-to-noise ratio of the main signal. Preferably, the inhibitor determines the predetermined threshold periodically.

The beam splitter of the exemplary embodiment of the present invention is a DFT filter bank using single side band modulation. Additionally, the present invention may comprise a beam selector for selecting at least one of a plurality of beams for adaptive filtering by the adaptive filter representing a direction from which the main signal is received. In this case, the adaptive filter updates coefficients representing the transform function and comprehensively stores the coefficients for each beam selected by the beam selector. In the exemplary embodiment, the beam selector selects the plurality of the beams for simultaneous adaptive filtering by the adaptive filter. Further, the beam selector may select a beam having a fixed direction and a beam which rotates in direction.

The present invention may further comprise a noise gate for gating the main signal adaptively filtered by the adaptive filter by opening the noise gate when a signal-to-noise ratio at the near end is above a predetermined threshold and closing the noise gate when the signal-to-noise ratio at the near end is below the predetermined threshold. In this case, the noise gate determines the predetermined threshold by selecting a low threshold when a signal-to-noise ratio of the reference signal of the far end is low, updating the predetermined threshold upwards when the signal-to-noise ratio of the reference signal of the far end goes up and gradually reducing the predetermined threshold when the signal-to-noise ratio of the reference signal of the far end goes down.

BRIEF DESCRIPTION OF THE DRAWINGS

A more complete appreciation of the present invention and many of its attendant advantages will be readily obtained by reference to the following detailed description considered in connection with the accompanying drawings, in which.

DETAILED DESCRIPTION

Figure 1:
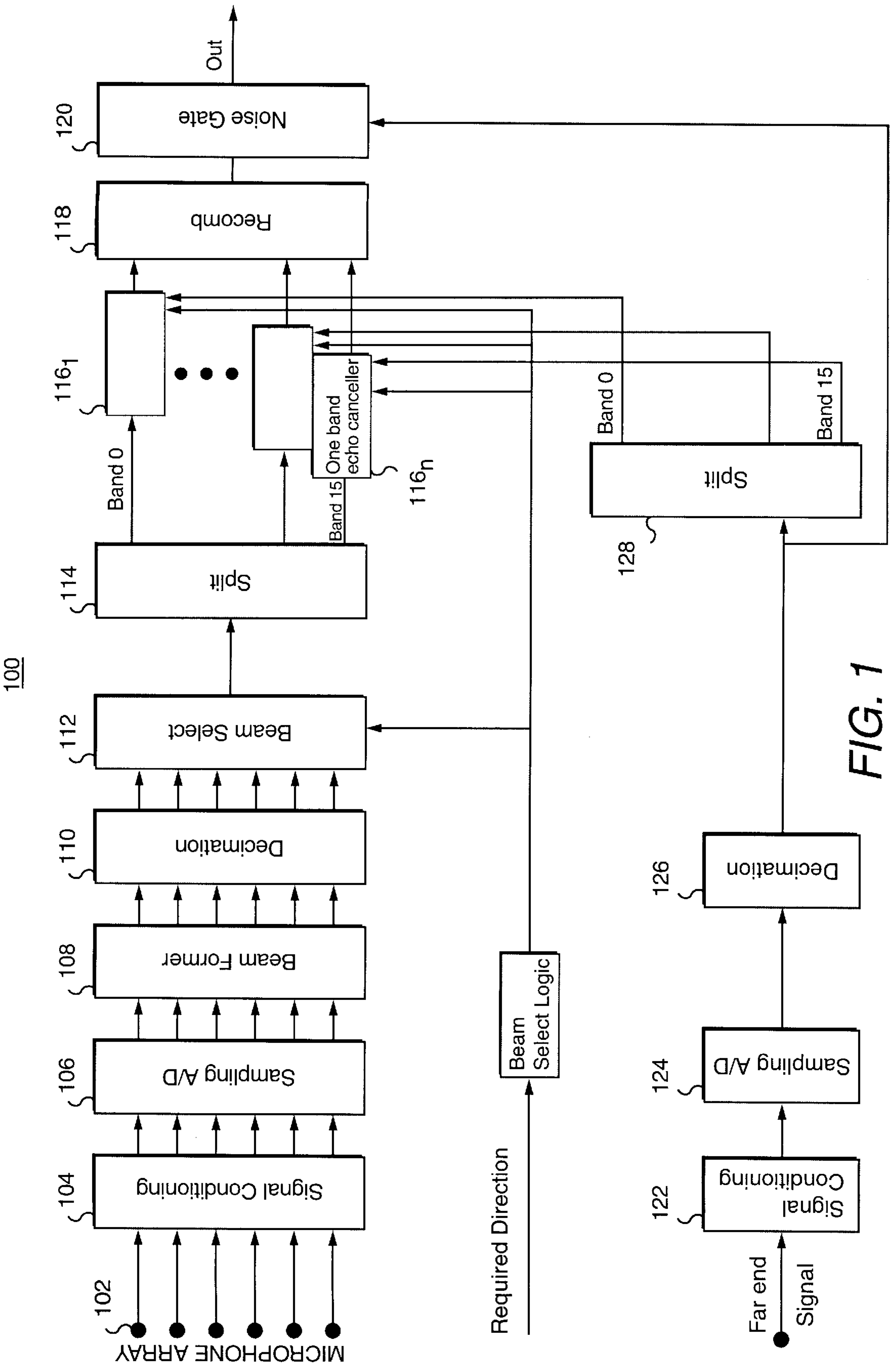
FIG. 1 illustrates the interference canceling system of the present invention.

FIG. 1 illustrates the exemplary echo canceling system of the present invention. An array of microphone elements 102 receive and convert acoustic sound in a room into an analog signal which is amplified by the signal conditioning block 104 and converted into digital form by the A/D converter 106. While FIG. 1 appears to depict the microphone elements 102 as an array, it will be appreciated by those skilled in the art that other configurations are readily applicable to the present invention. The microphone elements, for example, may be arranged in a circular array, a linear, or any other type of array. The A/D converter 106 may be an array of Delta Sigma converters set to, for example, a sampling frequency of 64 KHz per channel but, of course, may be substituted with other types of converters and sampling frequencies which are suitable as those skilled in the art will readily understand.

The sampled signals of each microphone are stored in a tap delay line (not shown) and multiplied by a steering matrix in the beam forming unit 108 to form a number of directional beams. As an example, 6 beams are formed which are aimed in directions evenly spread over 360 degrees (60 degrees apart). Of course, the present invention is not limited to any specific number of beams as one skilled in the art will readily understand. The beam signals are then low pass filtered to, for example, 8 KHz and decimated by decimating unit 110 to reduce the sampling rate and hence the computational load on the system. In this manner, the sampling rate is reduced to 16 KHz for each channel. It shall be appreciated that the decimation process may be performed prior to the beamforming process to further reduce the processing burden.

The system receives an indication as to the direction of the speaker either through a direction finding system or through a manual steering process. In the exemplary embodiment, the beam select logic unit 112 selects the beam with the closest direction to that actual and performs echo cancellation processing on the selected beam.

A particular aspect of the present invention is that the selected beam is split into a number of frequency bands, preferably 16 evenly spaced bands, by the beam splitter 114 such that echo cancellation processing is performed on each frequency band separately. Without this arrangement, an echo which typically lasts for more than 100 msec would require an adaptive filter, assuming that the filter samples the 100 msec of signal at a rate of 16 KHz, to have 1600 coefficients. Such a long adaptive filter is not likely to converge in the time that the echo is present. Moreover, an adaptive filter of 1600 coefficients presents an enormous processing burden which is unrealistic to handle. By splitting the bands into, for example, 16 channels the present invention reduces the sampling rate for each adaptive filter to, in this case, 2 KHz per channel. It will be appreciated that, not only is this system much more manageable, the adaptive filters can be optimized for each frequency separately by, for example, selecting longer filters for lower frequencies where the echo is typically located and shorter filters for higher frequencies where the echo is less. In this case, the filter lengths range, for example, from 16 to 128 coefficients. With this arrangement, the adaptive filters can converge much more easily with these lengths, the treatment of each band is independent from the others thereby preventing the problem of a broadband filter concentrating on a band limited interference while ignoring less pronounced ones and the processing burden is reduced.

Meanwhile, the far end signal (referred to as the reference channel) is conditioned, sampled, decimated and split in the manner discussed above by respective signal conditioning block 122, A/D converters 124, decimating unit 126 and splitter 128. Each band of the selected beam is processed for echo reduction using echo canceling unit $\mathbf{116}_{1\text{-}m}$. While Normalized LMS filters are preferred, those skilled in the art will readily understand that other type of adaptive filters are applicable to the present invention. The resulting echo-free signals of the different frequency bands are recombined into one broadband output by a recombine output unit 118.

The output of the recombined process is fed into a noise gate processor 120. The purpose of the noise gate is to prevent steady background noise in the room (such as fan noise) from being transmitted to the far end system and eliminate residual echoes. The system of the present invention measures the level of the steady noise and blocks up the signals that are below a certain threshold above this noise level. When residual echoes are present they may penetrate the process and be transmitted to the far end system. In order to prevent that, the blocking threshold is actively adjusted to the level of the signal present at the reference channel (far end). When a high level energy is detected at the far end signal, the threshold will be boosted up and gradually reduced when this signal disappears. This will prevent residual echoes from being transmitted while leaving only speech signals from the near end.

Figure 2:
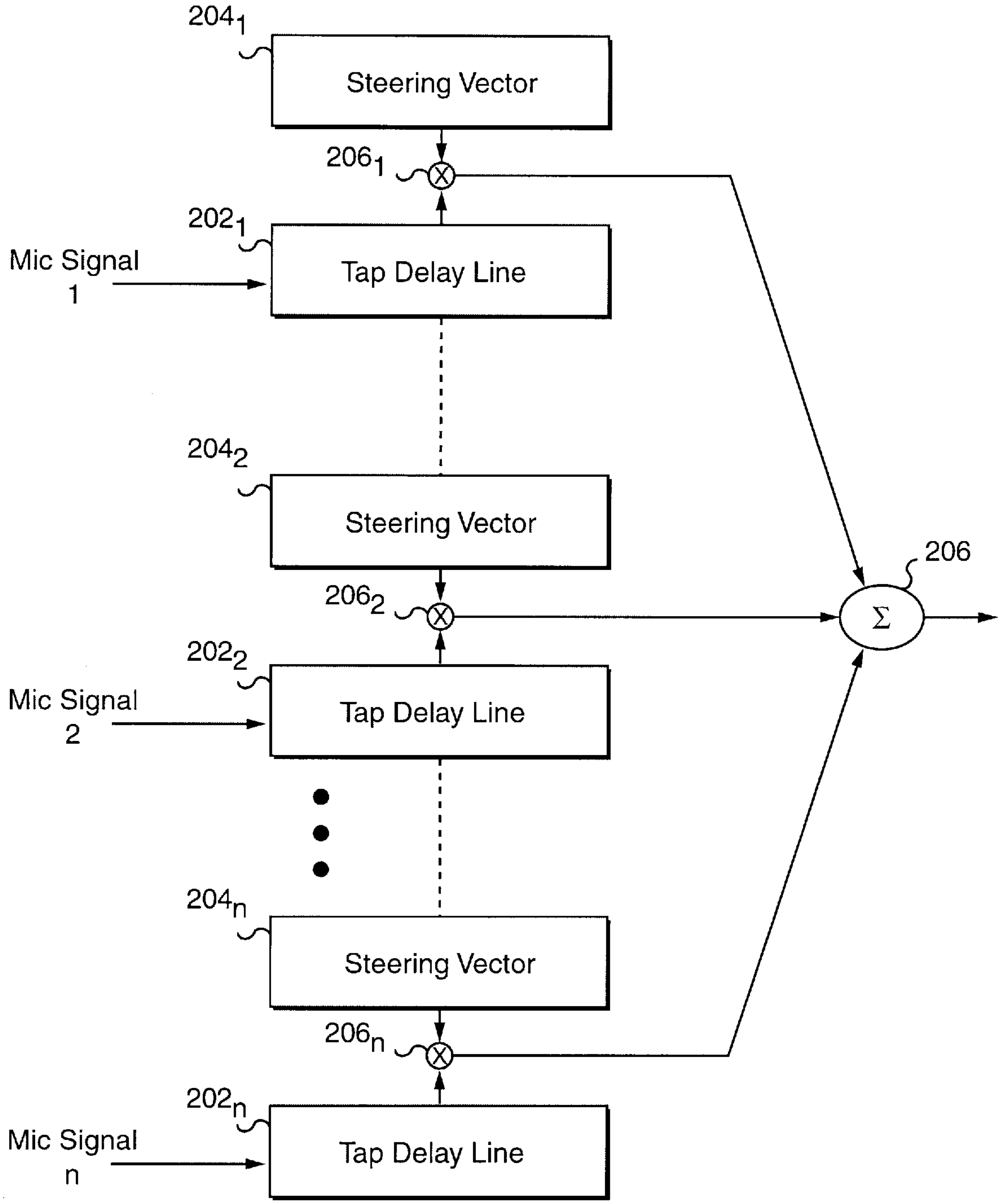
FIG. 2 illustrates the beamforming unit of the present invention.

FIG. 2 illustrates the beamforming unit 200 (FIG. 1, 108) of the present invention. Signals originated at a certain relative direction to the microphone array arrive at different phases to each microphone. Summing them up will create a reduced signal depending on the phase shift between the microphones. The reduction goes down to zero when the phases of the microphones are the same, thus creating a preferred direction while reducing all other directions. In the beamforming process, the microphone signals are phase shifted to create a zero phase difference for signals originated at a predetermined direction. The phase shift is achieved by multiplying the microphone signal stored in the tap delay lines $\mathbf{202}_{1\text{-}n}$ by a FIR filter coefficient or steering vector output from steering vector units $\mathbf{204}_{1\text{-}n}$.

In one embodiment, a different weight is applied for each microphone to create a shading effect and reduce the side lobe level. The weighting factors are implemented as part of the FIR filter coefficients. The filters for each direction and each microphone are pre-designed and stored as a steering vector matrix $\mathbf{204}_{1\text{-}n}$. The microphone signals are stored in a tapped delay line 2021-n with the length of the FIR filter. For each direction, each microphone delay line is multiplied by multipliers $\mathbf{206}_{1\text{-}n}$ by its FIR and summed with the other microphones after they have been multiplied. The process repeats for each direction resulting in a beam output for each direction.

Figure 3:
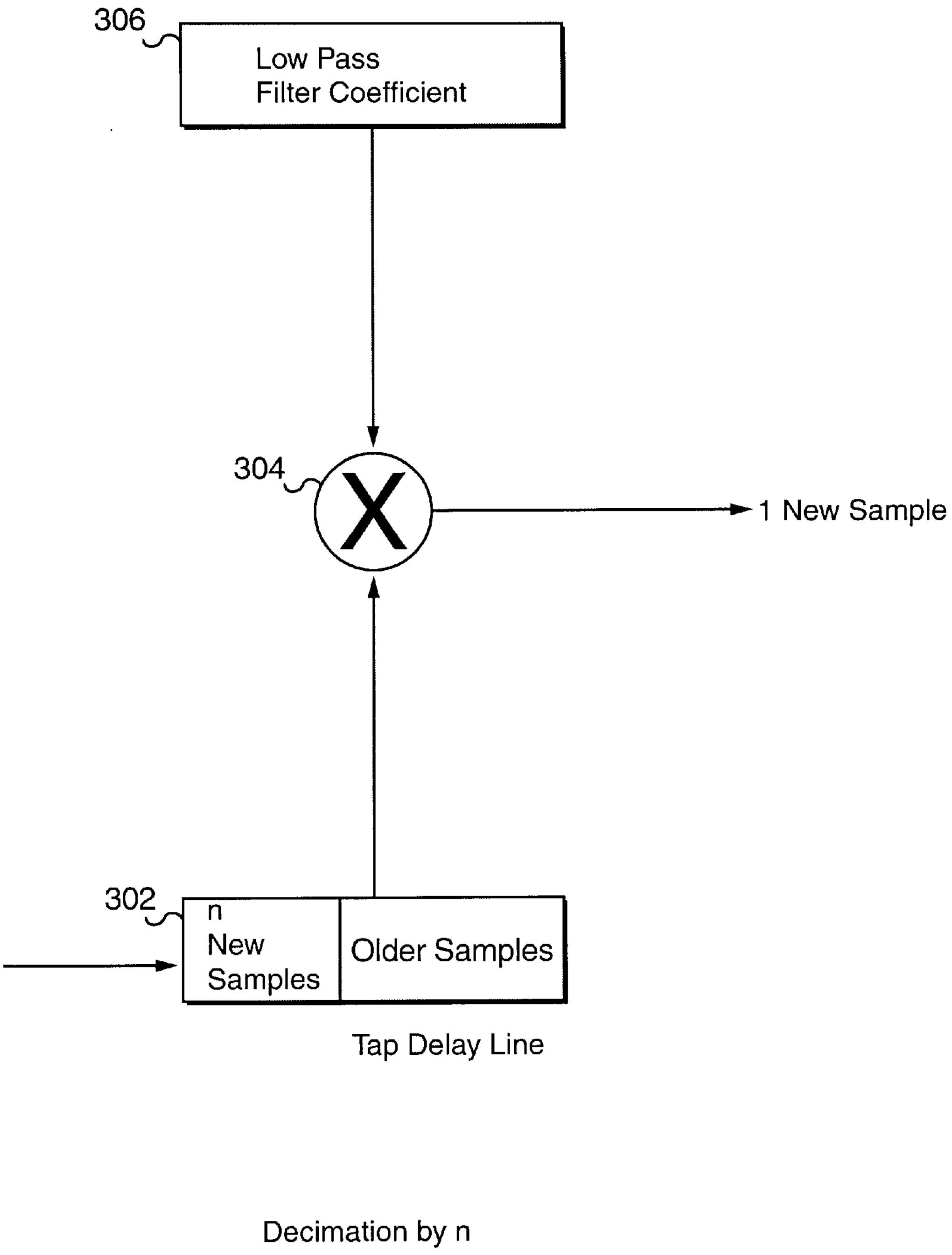
FIG. 3 illustrates the decimation unit of the present invention.

FIG. 3 illustrates the decimation unit 300 (FIG. 1, 110, 126) of the present invention. Decimation, which is intended to reduce the sampling frequency, can be done only once the high frequency elements are removed to maintain the Nyquist criteria. For example, if the sampling frequency is to be reduced to 16 KHz, it is necessary to make sure that the signal does not contain elements above 8 KHz because sampling will result in aliasing. In order to remove the troublesome high frequencies, the signals are first filtered by a low pass filter that cuts off the higher frequencies. In more detail, the beam samples are stored in a tapped delay line 302 and multiplied via a multiplier 304 by a low pass filter coefficient produced by the low pass filter 306.

Figure 4:
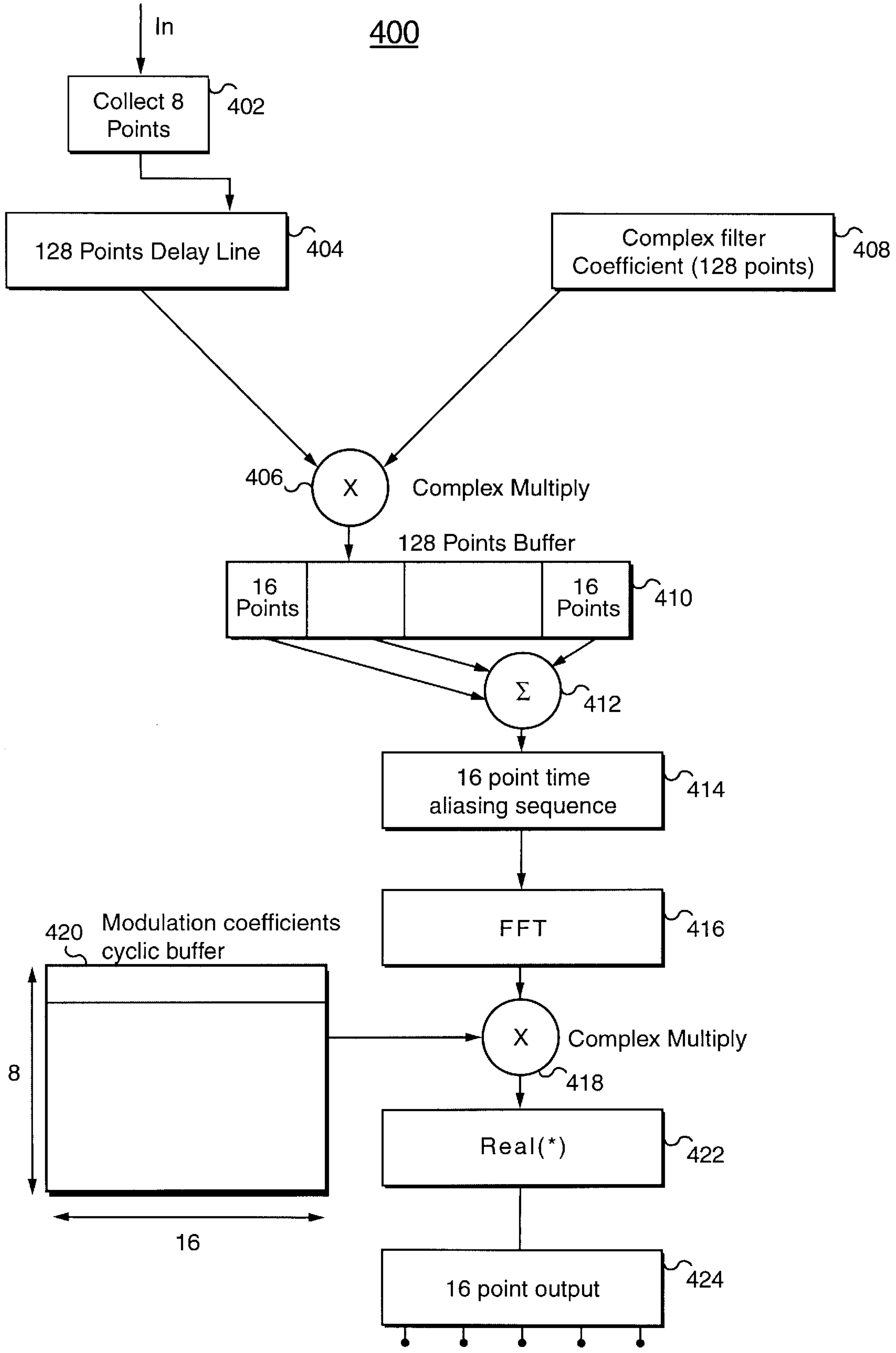
FIG. 4 illustrates the beam splitting unit of the present invention.

FIG. 4 illustrates the beam splitting unit 400 (FIG. 1, 114, 128) of the present invention. Although various beam splitting techniques may be employed, it is preferred that the generalized DFT filter bank using single side band modulation be employed as described, for example, in "*Multirate*

*Digital Signal Processing*", Ronald E. Crochiere, Prentice Hall Signal Processing Series or "*Multirate Digitals Filters, Filter Banks, Polyphase Networks, and Applications A Tutorial*", P. P. Vaidyanathan, Proceedings of the IEEE, Vol. 78, No. 1, January 1990. The goal of the beam splitter is to split the input signal into a plurality of limited frequency bands, preferably 16 evenly spaced bands. In essence, the beam splitting processes, for example, 8 input points at a time resulting in 16 output points each representing 1 time domain sample per frequency band. Of course, other quantities of samples may be processed depending upon the processing power of the system as will be appreciated by those skilled in the art.

In more detail, the 8 input points 402 are stored in a 128 tap delay line 404 representing a 128 points input vector which is multiplied via a multiplier 406 by the coefficients a 128 points complex coefficients pre-designed filter 408. The 128 complex points result vector is folded by storing the multiplication result in the 128 points buffer 410 and summing the first 16 points with the second 16 points and so on using a summer 412. The folded result, which is referred to as an aliasing sequence 414, is processed through a 16 points FFT 416. The output of the FFT is multiplied via a multiplier 418 by the modulation coefficients of a 16 points modulation coefficients cyclic buffer 420. The cyclic buffer which contains, for example, 8 groups of 16 coefficients, selects a new group each cycle. The real portion of the multiplication result is stored in the real buffer 422 as the requested 16-point output 424.

Figure 5:
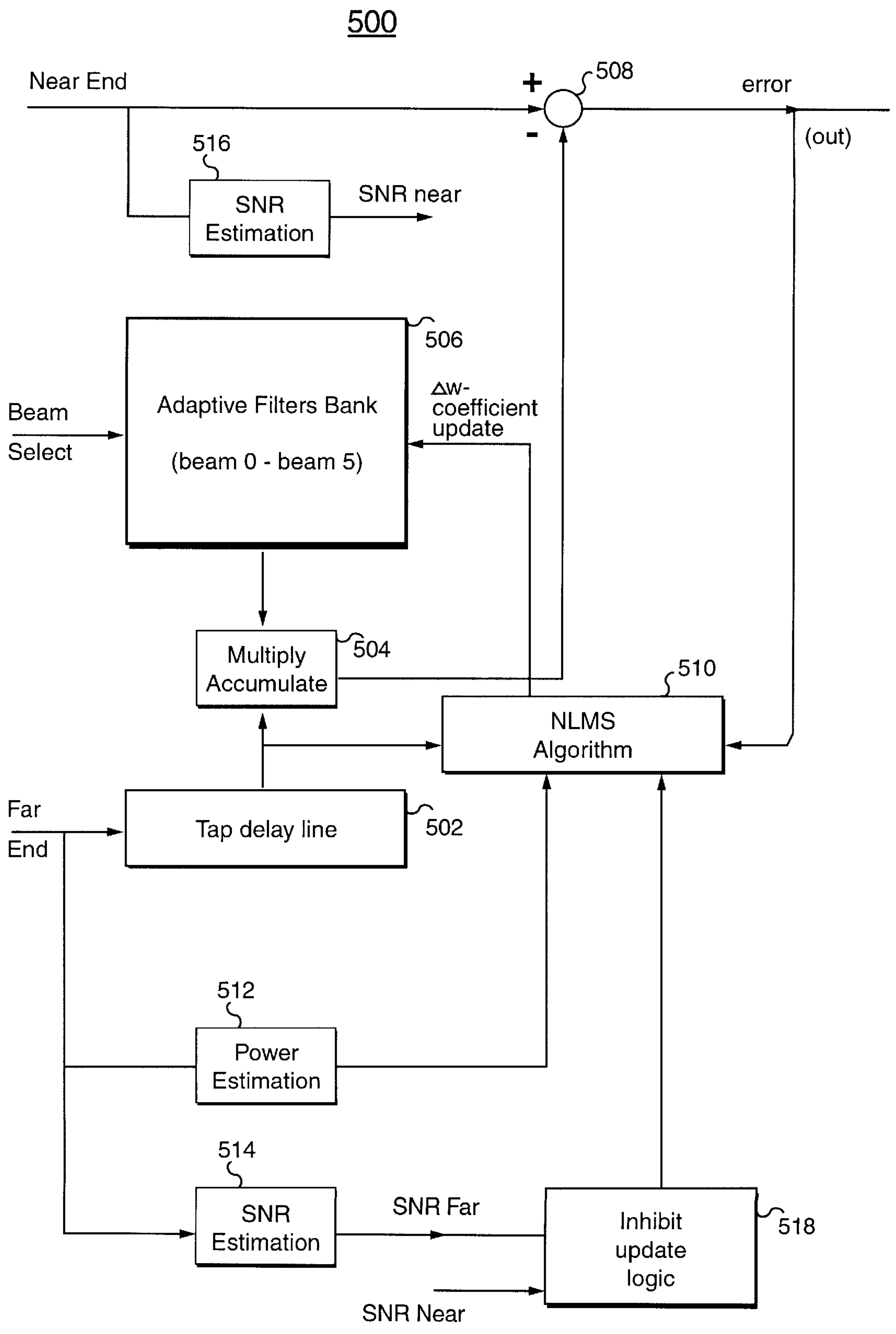
FIG. 5 illustrates the adaptive filter of the present invention.

FIG. 5 illustrates the adaptive filter 500 (FIG. 1, $\mathbf{116}_{1\text{-}n}$) of the present invention. The reference channel that contains the far end signal is stored in a tap delay line 502 and multiplied via a multiplier 504 by a filter 506 to obtain the estimated echo elements present in the beam signal. The estimated interference signal is then subtracted via subtractor 508 from the beam signal to obtain an echo free signal.

The filter 506 is adjusted by the NLMS (Normalized Least Mean Square) processor 510 to estimate the transfer function of the loudspeaker to the beamforming process. In other words, the filter 506 simulates the transform that the far end signal goes through when transmitted by the loudspeaker into the air, bouncing back from the walls, received by the microphones and applied to the beamforming process of the present invention. In order to determine the precise filter coefficients, the system tries to obtain minimum energy at the output by modifying the filter coefficients (W) according to the following formula:

$$W(n,t+1)=W(n,t)+X(n)*E*A \quad (1)$$

Wherein, n is the nth coefficient of W, t is time, E is the error signal output and A is a normalized factor that determines the size of the adaptation process. The normalization is obtained by dividing a fixed value (adaptation factor) by P, the reference channel energy. The normalization is intended to prevent fast steps when the signal is strong (i.e., X and E are large) and small steps when weak (i.e., X and E are small) which provides smooth performance over all ranges of signal levels.

When a fast attack in the reference signal appears, such as when an abrupt sound, e.g., speech, noise, is generated at the far end, the energy estimation process may be too slow in reaction resulting in large steps of adaptation and divergence of the filter. To prevent this, the new X*X is compared to the energy estimation calculated by power estimator 512 and if the ratio exceeds a certain threshold (meaning a fast increase in the signal level) the value of X*X replaces the energy estimation.

If the content of the near end signal is much stronger than the content of the far end signal the filter may diverge or converge to wrong values and start distorting the desired signal. It is preferred that the adaptation process will occur when relevant echo signals are present in the beam signal. To determine this, the system calculates the SNR of the far end signal and the SNR of the near end signal using the SNR estimation units 514, 516. If speech is present in the near end signal, the SNR of the beam will be stronger than that of the reference channel. Thus, when the SNR of the reference channel raises up above a predetermined threshold over the near end SNR, the inhibit update logic block 518 immediately allows the LMS coefficient to be updated. Conversely, the inhibit update logic block will allow, for example, 100 msec of adaptation and then inhibit the adaptation when the ratio drops below the threshold. At this point, the coefficients of the adaptive filter of the present invention "freeze" and the filtering will use the latest value of the coefficients. Later, when adaptation is no longer inhibited, the filters are updated from the values at which they were "frozen".

The exemplary embodiment determines the predetermined threshold for the inhibit update logic block 518 in discrete periods. The timing of these discrete periods is determined in part by the hysteresis that differentiates between the reaction time of the attack to that of the decay of the SNR ratios which are obtained through the reaction time of the energy calculation. More specifically, the SNR is computed by dividing two values, the noise level and the signal level. The energy of each block of both the reference and the beam are calculated using a exponential running average of the absolute value of the data. In the exemplary embodiment, the block size is defined as 20 msec of data which is considered to contain the signal level. The present invention searches the lowest energy of a block in the current period, for example, previous 2 sec. Every 2 Sec the system resets and starts recording the value of the block energy and replacing the value when a lower value is calculated. When the current 2 sec time period has elapsed, the calculated noise level is copied and recorded as the current noise level while the system resets the calculation process for the next noise level which will be used for the next 2 sec period.

It will be appreciated from the foregoing description that the present invention stores the values of the coefficients for each frequency band and for each beam direction separately. Once the beam selector 112 selects a new beam, the appropriate values of the beam will be selected. In this way, the system will keep a record of the transfer function between each beam and the beamformer, and the adaptation to the echoes in the new direction will be updated. This process allows the use of directional beamforming while providing a fast adaptation time which obviates the need to perform while the process for either all of the microphones or all the beams.

In another embodiment, which updates the adaptation coefficients even more frequently, the present invention as described is applied on a plurality of beams at a time. For purposes of example, the present invention selects two beams, one which is selectively directed and the other which is actively rotated periodically, for example, every 40 msec. In the alternative, predetermined beams may be selected more often than others. With this arrangement, a different beam will be selected for each block in addition to the main beam and will be processed according to the aforementioned adaptation process of the present invention. While this method increases computation load, it ensures that the coefficients in all directions, particularly those predetermined, are updated more frequently.

Figure 6:
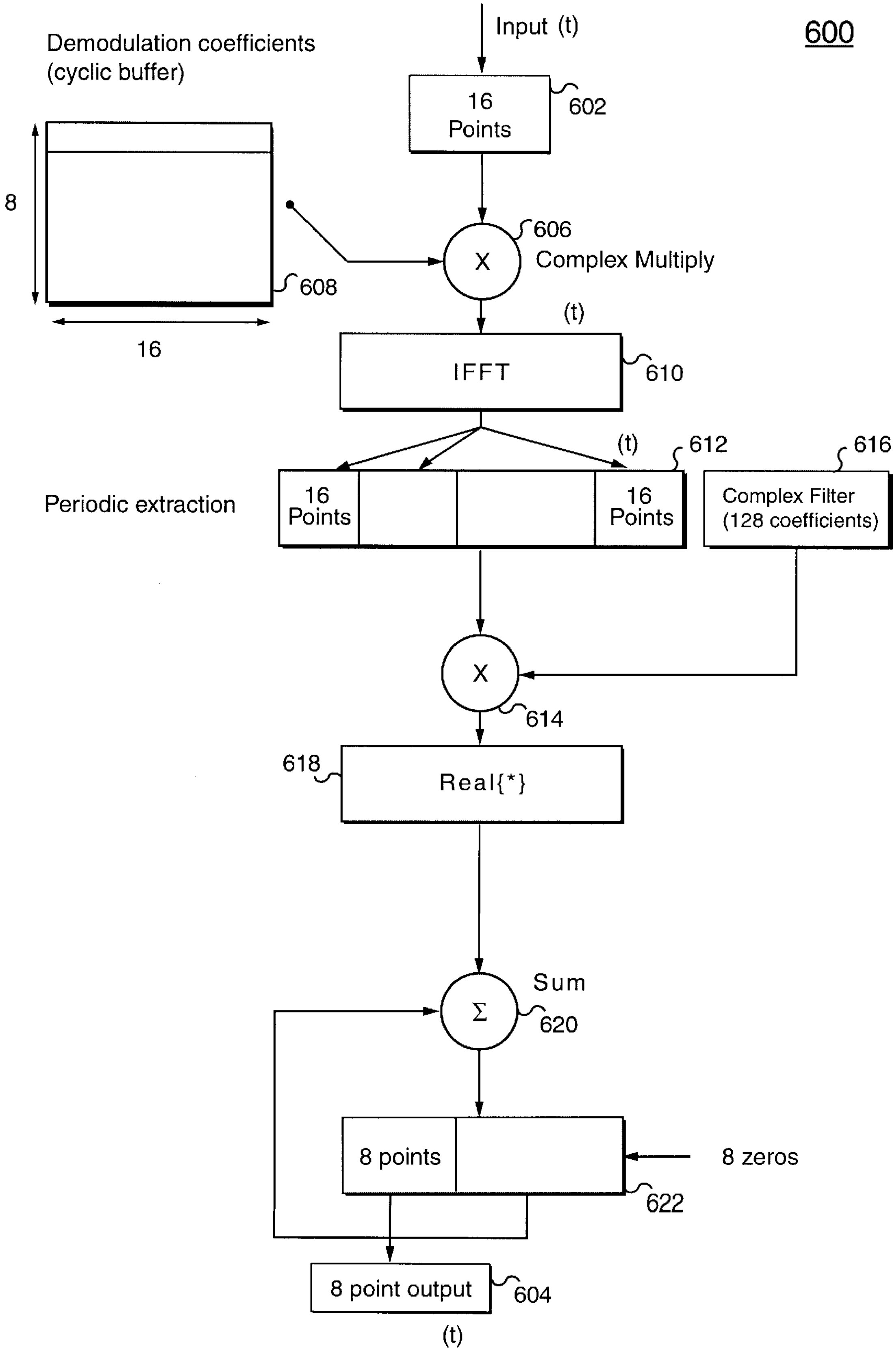
FIG. 6 illustrates the recombining unit of the present invention.

FIG. 6 illustrates the recombining unit 600 (FIG. 1, 118) of the present invention which is symmetrical, i.e., opposite, to the band splitting technique described above. The goal here is to recombine the 16 limited frequency bands of the echo free signal into one broad band output. The process goes through an IFFT process but both the input and output are time domain signals. The recombining unit of the exemplary embodiment processes 16 input points 602 each representing 1 time domain sample per frequency band resulting in 8 output points 604 of the broadband signal. Of course, those skilled in the art will readily understand that other quantities of sampling input points are applicable to the present invention.

In more detail, the new 16 input points 602 are multiplied by a multiplier 606 with a 16 points demodulation filter coefficient which is stored in a demodulation coefficients cyclic buffer 608 containing, for example, 8 groups of 16 coefficients wherein a new group is selected each cycle. The result is processed through a 16 points IFFT 610, or any equivalent transform, and the result of this Inverse Fast Fourier Transform is extracted to 128 complex points by duplicating the 16 points data 8 times. The 128 points result vector which is stored in a buffer 612 is multiplied via the multiplier 614 by a 128 point complex coefficient generated by a predesigned complex filter 616 and stored in real buffer 618. The real portion of the result is summed by summer 620 into a 128 points cyclic history buffer 622 in which the oldest 8 points are taken as the result 604 and replaced with zeros in the buffer 622 for the next iteration of the recombination process.

Figure 7:
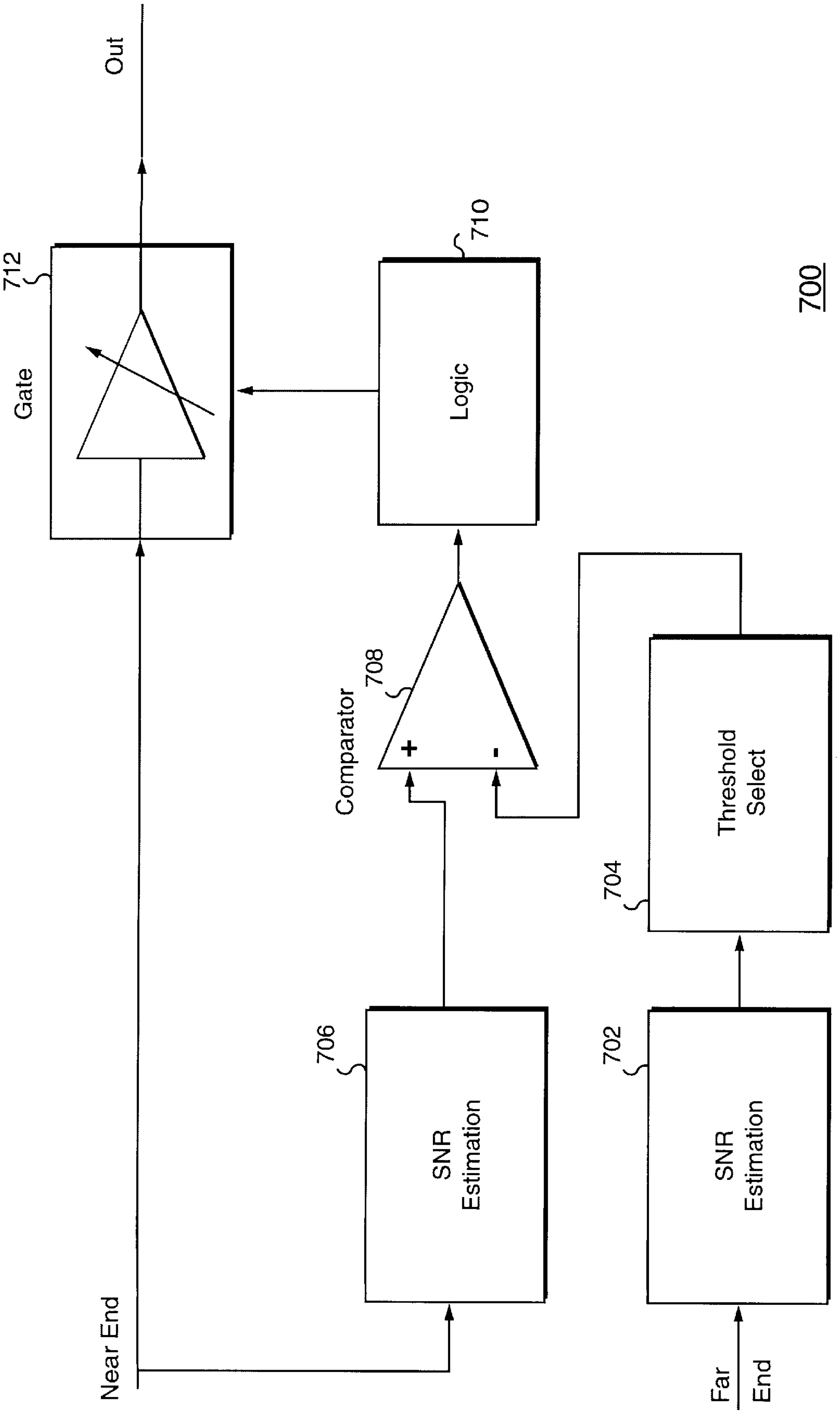
FIG. 7 illustrates the noise gate of the present invention.

FIG. 7 illustrates the noise gate system 700 (FIG. 1, 120) of the present invention. The far end signal-to-noise ratio SNR is calculated by SNR estimation unit 702 which estimates the signal energy of the current block (40 msec in the exemplary embodiment) and divides the signal energy by the lowest estimated block energy in the current period (2 sec in the exemplary embodiment). The threshold is selected by the threshold select depending on the far end signal-to-noise ratio SNR. When the far end SNR is low, a low threshold is selected. Once the SNR of the far end goes up, the threshold is updated immediately upwards by the threshold selection unit 704. When the far end SNR goes down, the threshold is gradually reduced to a minimum with a decay time in the exemplary embodiment around 100 msec.

The near end signal-to-noise ratio SNR is measured by the SNR estimation unit 706 in the same manner. Then, the near end SNR signal is compared by the comparator 708 to the selected threshold. According to the logic provided by the logic circuit 710, if the difference is positive, meaning that the near end signal is present, the gate 712 is open, preferably immediately or quickly (e.g., so as to not miss a syllable, for instance in less than about 10 msec or less such as instantly or nearly instantly). On the other hand, if the result of the comparison is negative, meaning that the near end signal is not above the allowed threshold, the gate is closed and the level of sound is significantly reduced such that the reduced signal is transmitted to the far end system. The reduction of the sound or the closure of the gate is preferably gradual such as over about 100 msec or longer, e.g., over about 0.5 sec or 1.0 sec, so as to prevent a pumping sound or noise transmission when a user is speaking fast and to have the gate truly close when there is a real pause or silence.

It will be appreciated from the foregoing description that the present invention provides an echo-canceling system which overcomes the problem of background noise in the conferencing system, reduces the residual echo to a minimum, allows full duplex communication and provides a steerable directional audio beam.

Although preferred embodiments of the present invention and modifications thereof have been described in detail herein, it is to be understood that this invention is not limited to those precise embodiments and modifications, and that other modifications and variations may be effected by one skilled in the art without departing from the spirit and scope of the invention as defined by the appended claims.

We claim:

1. An interference canceling apparatus for canceling, from a target signal generated from a target source, an interference signal generated by an interference source, said apparatus comprising:

a main input for inputting said target signal;

a reference input for inputting said interference signal;

a beam splitter for beam-splitting said target signal into a plurality of band-limited target signals and beam-splitting said interference signal into band-limited interference signals, wherein the amount and frequency of band-limited target signals equal the amount and frequency of band-limited interference signals, whereby for each band-limited target signal there is a corresponding band-limited interference signal;

an adaptive filter for adaptively filtering, each band-limited interference signal from each corresponding band-limited target signal.

2. The apparatus according to claim 1, wherein said target signal represents speech generated at a near end of a teleconference, said reference signal represents said target signal broadcast from a far end of said teleconference and said interference signal represents an echo generated by said broadcast of said reference signal of said far end.

3. The apparatus according to claim 2, wherein said adaptive filter is an adaptive filter array with each adaptive filter in said array filtering a different frequency band.

4. The apparatus according to claim 2, wherein said adaptive filter estimates a transfer function of said reference signal broadcast of said far end.

5. The apparatus according to claim 4, further comprising an inhibitor for permitting said adaptive filter to change coefficients when a signal-to-noise ratio of said reference signal exceeds a predetermined threshold over a signal-to-noise ratio of said main signal.

6. The apparatus according to claim 5, wherein said inhibitor determines said predetermined threshold periodically.

7. The apparatus according to claim 2, wherein said beam splitter is a DFT filter bank using single side band modulation.

8. The apparatus according to claim 2, further comprising a beam selector for selecting at least one of a plurality of beams for adaptive filtering by said adaptive filter representing a direction from which said main signal is received.

9. The apparatus according to claim 8, wherein said adaptive filter updates coefficients representing said transform function and comprehensively stores said coefficients for each beam selected by said beam selector.

10. The apparatus according to claim 8, wherein said beam selector selects said plurality of said beams for simultaneous adaptive filtering by said adaptive filter.

11. The apparatus according to claim 10, wherein said beam selector selects a beam having a fixed direction and a beam which rotates in direction.

12. The apparatus according to claim 2, further comprising a noise gate for gating said main signal adaptively filtered by said adaptive filter by opening said noise gate when a signal-to-noise ratio at the near end is above a predetermined threshold and gradually closing said noise gate when said signal-to-noise ratio at the near end is below the predetermined threshold; wherein said noise gate determines said predetermined threshold by selecting a low threshold when a signal-to-noise ratio of said reference signal of the far end is low, updating said predetermined threshold upwards when said signal-to-noise ratio of said reference signal of the far end goes up and gradually reducing said predetermined threshold when said signal-to-noise ratio of the reference signal at the far end goes down.

13. An interference canceling apparatus for canceling, from a target signal generated from a target source an interference signal generated by an interference source, said apparatus comprising:

main input means for inputting said target signal;

reference input means for inputting said interference signal;

beam splitter means for beam-splitting said target signal into a plurality of band-limited target signals and beam-splitting said interference signal into band-limited interference signals, wherein the amount and frequency of band-limited target signals equal the amount and frequency of band-limited interference signals, whereby for each band-limited target signal there is a corresponding band-limited interference signal; and adaptive filter means for adaptively filtering, according to said plurality of frequency bands, each band-limited interference signal from each corresponding band-limited target signal.

14. The apparatus according to claim 13, wherein said target signal represents speech generated at a near end of a teleconference, said reference signal represents said target signal broadcast from a far end of said teleconference and said interference signal represents an echo generated by said broadcast of said reference signal of said far end.

15. The apparatus according to claim 14, wherein said adaptive filter means is an adaptive filter array with each adaptive filter in said array filtering a different frequency band.

16. The apparatus according to claim 14, wherein said adaptive filter means estimates a transfer function of said reference signal broadcast of said far end.

17. The apparatus according to claim 16, further comprising inhibitor means for permitting said adaptive filter to change coefficients means when a signal-to-noise ratio of said reference signal exceeds a predetermined threshold over a signal-to-noise ratio of said main signal.

18. The apparatus according to claim 17, wherein said inhibitor means determines said predetermined threshold periodically.

19. The apparatus according to claim 14, wherein said beam splitter means is a DFT filter bank using single side band modulation.

20. The apparatus according to claim 14, further comprising beam selector means for selecting at least one of a plurality of beams for adaptive filtering by said adaptive filter means representing a direction from which said main signal is received.

21. The apparatus according to claim 20, wherein said adaptive filter means updates coefficients representing said transform function and comprehensively stores said coefficients for each beam selected by said beam selector means.

22. The apparatus according to claim 20, wherein said beam selector means selects said plurality of said beams for simultaneous adaptive filtering by said adaptive filter means.

23. The apparatus according to claim 22, wherein said beam selector means selects a beam having a fixed direction and a beam which rotates in direction.

24. The apparatus according to claim 14, further comprising noise gate means for gating said main signal adaptively filtered by said adaptive filter means by opening said noise gate means when a signal-to-noise ratio at the near end is above a predetermined threshold and closing said noise gate means when said signal-to-noise ratio at the near end is below the predetermined threshold; wherein said noise gate means determines said predetermined threshold by selecting a low threshold when a signal-to-noise ratio of said reference signal from the far end is low, updating said predetermined threshold upwards when said signal-to-noise ratio of said reference signal of the far end goes up and gradually reducing said predetermined threshold when said signal-to-noise ratio of the reference signal at the far end goes down.

25. An interference canceling method for canceling, from a target signal generated from a target source, an interference signal generated by an interference source, said method comprising the steps of:

inputting said target signal;

inputting said interference signal;

beam-splitting said target signal into a plurality of band-limited target signals and beam-splitting said interference signal into band-limited interference signals, wherein the amount and frequency of band-limited target signals equal the amount and frequency of band-limited interference signals, whereby for each band-limited target signal there is a corresponding band-limited interference signal; and adaptively filtering, each band-limited interference signal from each corresponding band-limited target signal.

26. The method according to claim 25, wherein said target signal represents speech generated at a near end of a teleconference, said reference signal represents said target signal broadcast from a far end of said teleconference and said interference signal represents an echo generated by said broadcast of said reference signal of said far end.

27. The method according to claim 26, wherein said step of adaptive filtering filters said band-limited target signals separately according to the frequency band.

28. The method according to claim 26, wherein said step of adaptive filtering estimates a transfer function of said reference signal broadcast of said far end.

29. The method according to claim 28, further comprising the step of permitting said step of adaptive filtering to include changing coefficients when a signal-to-noise ratio of said reference signal exceeds a predetermined threshold over a signal-to-noise ratio of said main signal.

30. The method according to claim 29, wherein said step of inhibiting determines said predetermined threshold periodically.

31. The method according to claim 26, wherein said step of beam splitting performs beam splitting using a DFT filter bank with single side band modulation.

32. The method according to claim 26, further comprising the step of beam selecting at least one of a plurality of beams for adaptive filtering in said step of adaptive filtering representing a direction from which said main signal is received.

33. The method according to claim 32, wherein said step of adaptive filtering updates coefficients representing said transform function and comprehensively stores said coefficients for each beam selected in said step of beam selecting.

34. The method according to claim 32, wherein said step of beam selecting selects said plurality of said beams for simultaneous adaptive filtering in said step of adaptive filtering.

35. The method according to claim 34, wherein said step of beam selecting selects a beam having a fixed direction and a beam which rotates in direction.

36. The method according to claim 26, further comprising the step of gating said main signal adaptively filtered in said step of adaptive filtering by opening a noise gate when a signal-to-noise ratio at the near end is above a predetermined threshold and closing said noise gate when said signal-to-noise ratio at the near end is below the predetermined threshold.

37. The method according to claim 36, further comprising the step of determining said predetermined threshold by selecting a low threshold when a signal-to-noise ratio of said reference signal at the far end is low, updating said predetermined threshold upwards when said signal-to-noise ratio of said reference signal at the far end goes up and gradually reducing said predetermined threshold when said signal-to-noise ratio of the reference signal from the far end goes down.

* * * * *